United States Patent [19]

Patel et al.

[11] 4,001,722
[45] Jan. 4, 1977

[54] INTEGRATED CIRCUIT RELAXATION OSCILLATOR

[75] Inventors: Suman H. Patel, Sunnyvale, Calif.; Thomas Jones, Glasgow, Scotland

[73] Assignee: National Semiconductor Corporation, Santa Clara, Calif.

[22] Filed: May 19, 1975

[21] Appl. No.: 578,517

[52] U.S. Cl. .......................... 331/111; 331/108 D
[51] Int. Cl.² ...................................... H03K 3/353
[58] Field of Search ........... 331/111, 108 C, 108 D

[56] References Cited
UNITED STATES PATENTS 3,883,825  5/1975  Cohen ............................... 331/111

*Primary Examiner*—Siegfried H. Grimm
*Attorney, Agent, or Firm*—Lowhurst & Aine

[57] ABSTRACT

An integrated circuit relaxation oscillator includes a capacitor, a resistor forming a conductive path for charging the capacitor, a transistor for discharging the capacitor, and a control circuit responsive to the level of charge on the capacitor for controlling the conduction level of the transistor. The control circuit has a relatively high trip point while it is in one state and during the time that the capacitor is being charged, and a relatively low trip point while it is in a second state and during the time that the capacitor is being discharged. The control circuit is balanced, such that variations in process parameters and variations in the voltage level of the power supply do not appreciably affect the period of the oscillatory output signal.

6 Claims, 7 Drawing Figures

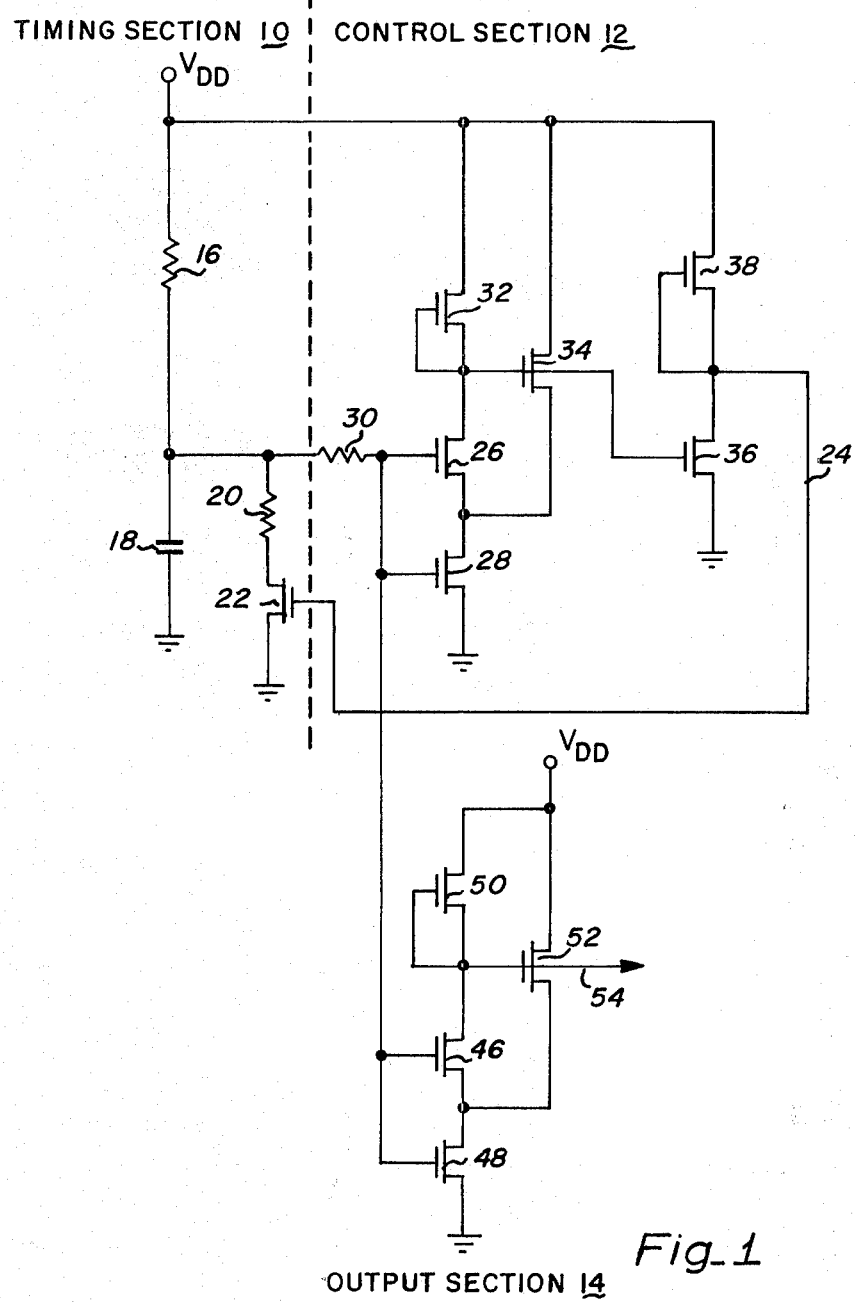
Fig_1

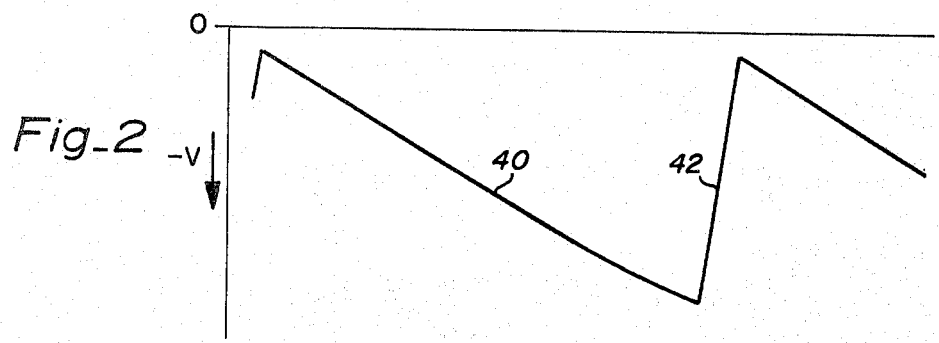
Fig_2
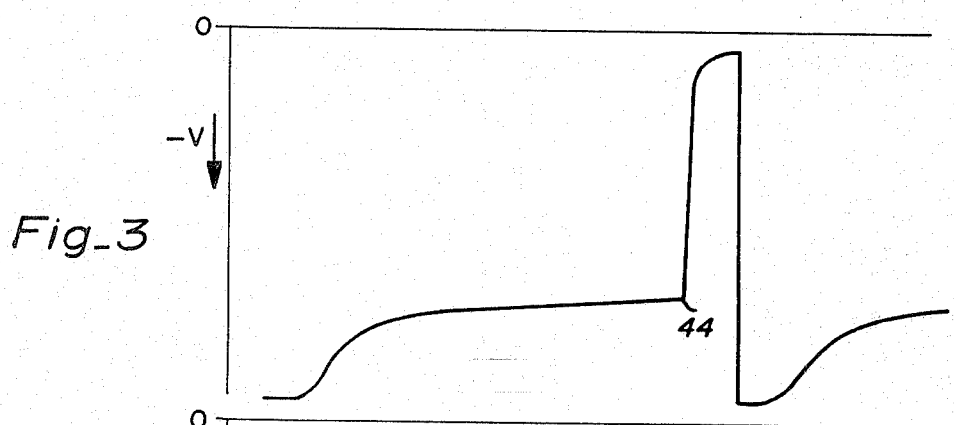
Fig_3
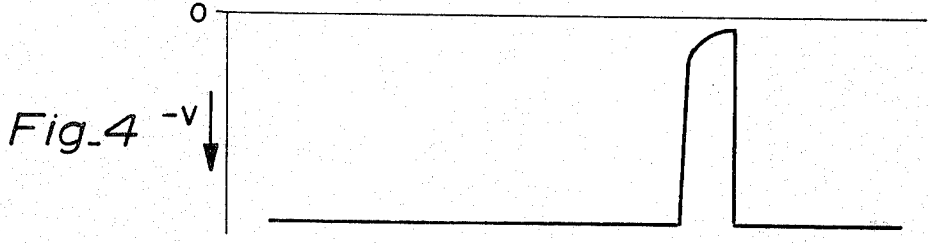
Fig_4
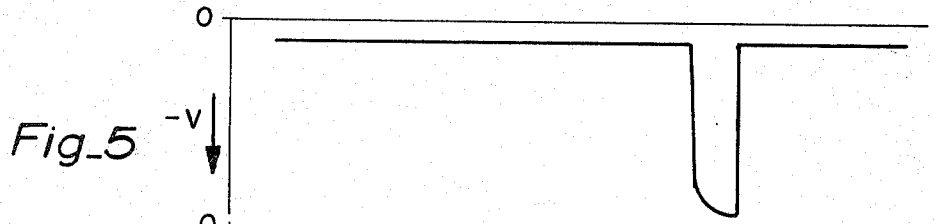
Fig_5
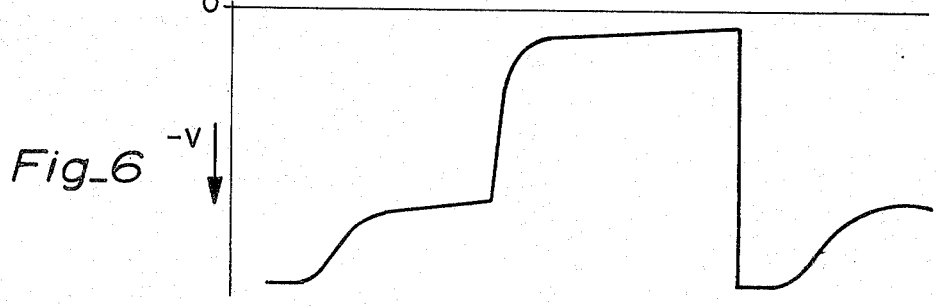
Fig_6
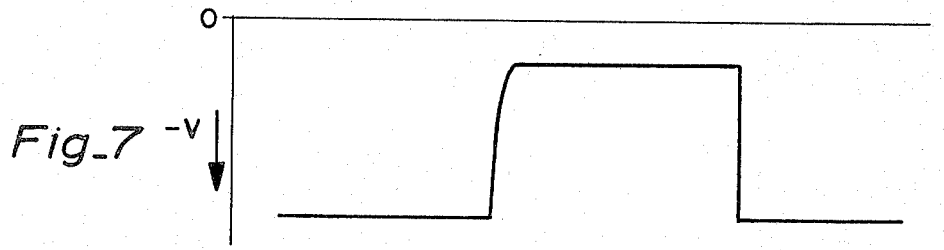
Fig_7

INTEGRATED CIRCUIT RELAXATION OSCILLATOR

BACKGROUND OF THE INVENTION

1. Field of the Invention

This invention relates generally to an oscillator circuit, and more particularly to an integrated circuit relaxation oscillator circuit having a relatively stable frequency.

2. Prior Art

Conventional integrated circuit relaxation oscillators generally exhibit relatively large variations in the period of their oscillatory output signal as a result of variations in transistor parameters due to the manufacturing process which produced the transistors and variations in the voltage level of their power supply. Wherever used herein, the terms "process parameters" are intended to include manufacturing process parameters. Those process parameters which provide the largest variations are the enhancement threshold voltage and the mobility and gate capacitance of field effect transistors (FET). Since the threshold voltage of an enhancement FET is that gate-source voltage which biases the FET at a transition between a conductive and a nonconductive state thereof, it can be appreciated that any variation in threshold voltage will have an appreciable influence on the operating characteristics of that FET. The threshold voltage of an FET may vary from −0.9 to −2.1 volts. Accordingly, it can be appreciated that such a variation will have an adverse affect on the period of the oscillatory output signal, unless circuit techniques are employed for cancelling or reducing the effects of variations in threshold voltage.

Since the resistance of an FET does not vary significantly with variations in the voltage level of the power supply connected thereto, the time required to charge or discharge each node of an oscillator circuit varies with variations in the voltage level of the power supply. If the time required to charge or discharge a particular node of the oscillator circuit varies under such conditions, obviously the period of the oscillatory output signal will also vary. Frequency variations of 20 to 1 can be expected in prior known integrated circuit oscillators as a result of process parameter variations and power supply variations. One known integrated circuit oscillator having an output frequency of 400 KHz has a frequency range of from 150 KHz to 900 KHz due to variations in process parameters.

Previous oscillators also exhibited start up problems. That is, relatively small variations in the process parameters of prior known oscillator could result in that oscillator being incapable of starting. Also, race condition problems exist in some of these prior known oscillators.

Previous integrated circuit oscillators were also susceptible to the problem of having more than one stable operating frequency. Usually, this problem is encountered when the voltage level of the oscillator power supply drops below a predetermined amplitude. This problem also occurs in some of the prior known integrated circuit oscillators when the power supply voltage is turned on and applied to the oscillator at a relatively slow rate.

It can be appreciated, therefore, that a need exists for an integrated circuit oscillator which exhibits a relatively small variation in frequency with variations in process parameters and/or variations in power supply levels. A need also exists for such an oscillator which has no start up problems, only one stable operating frequency, and is not subject to race conditions.

SUMMARY OF THE INVENTION

Accordingly, it is a primary object of the present invention to provide an integrated circuit relaxation oscillator which exhibits relatively small variations in frequency with variations in transistor parameters due to the manufacturing process which produced the transistors.

Another object of the present invention is to provide an integrated circuit oscillator which provides relatively small variations in frequency with variations in power supply levels.

A further object of the present invention is to provide an integrated circuit oscillator having only one stable operating frequency.

Still another object of the present invention is to provide an integrated circuit oscillator in which its nominal frequency can be changed or adjusted by the replacement of only one component or capacitor thereof.

Another object of the present invention is to provide an integrated circuit oscillator which is not prone to race conditions.

These and other objects of the present invention are attained by an integrated circuit relaxation oscillator which includes a capacitor, a resistor connected in series with the capacitor and forming a conduction path for charging the capacitor, a circuit element for discharging the capacitor, and a control circuit which is connected to the capacitor and has a relatively high trip point in a first state thereof for disabling the circuit element while it is in its first state, and a relatively low trip point while it is in a second state thereof for enabling the circuit element while it is in its second state. The control circuit is formed of a plurality of transistors which are connected together such that it is substantially insensitive to variations in process parameters and variations in the voltage level of the power supply connected thereto.

The invention, however, as well as other objects, features and advantages thereof will be more fully realized and understood from the following detailed description, when taken in conjunction with the accompanying drawings, wherein:

BRIEF DESCRIPTION OF THE DRAWINGS

FIG. 1 is a schematic diagram of an integrated circuit oscillator constructed in accordance with the principles of the present invention.

FIG. 2 is a graphical representation of an idealized waveform of the variations in the voltage charge versus time on the timing capacitor of the oscillator illustrated in FIG. 1.

FIGS. 3–5 are graphical representations of idealized waveforms of the voltage level versus time at various nodes in the control circuit illustrated in FIG. 1.

FIGS. 6 and 7 are graphical representations of idealized waveforms of the voltage versus time at various nodes of the output circuit illustrated in FIG. 1.

DETAILED DESCRIPTION OF THE PREFERRED EMBODIMENT

With reference to FIG. 1, there is shown an integrated circuit relaxation oscillator which is constructed in accordance with the principles of the present invention and includes a timing section 10, a control section 12 and an output section 14. The timing section 10 includes a resistor 16 and a capacitor 18 connected in series with one another between a source of negative potential and ground potential. A series connected resistor 20 and enhancement field effect transistor (FET) 22 are connected in parallel with the capacitor 18. The resistor 20 is a relatively small value of resistance and is employed to limit excessive currents through the FET 22. It can be appreciated from the drawing that when the FET 22 is nonconductive, the capacitor 18 will charge through the conductive path formed by the resistor 16. However, when the FET 22 is rendered conductive, the capacitor 18 will discharge to a relatively low level.

As used herein, the threshold voltage of an enhancement FET shall mean that gate-source voltage at which the FET is at the transition between a nonconductive and a conductive state thereof. The trip point of a stage, however, is that voltage level on the gate of the inverter FET at which the output of the stage containing that FET toggles or charges from one binary level to another binary level. A stage is considered to have toggled or changed to a different binary level when its output has passed through the trip point of a succeeding stage. Also, as used herein, a high level refers to a level which is relatively close to the negative supply voltage, and a low level refers to a level which is relatively close to ground potential.

The control section 12 has two stable states, one of which is represented by a low level signal at its output on a line 24 and the other of which is represented by a high level signal at its output. The line 24 is connected to the gate of the FET 22, such that a low level signal on the line 24 will render the FET 22 nonconductive and a high level signal on the line 24 will render the FET 22 conductive.

When the state of the control section 12 is such that a low level signal is generated at its output, it has a relatively high trip point, and when the state of the control section 12 is such that it generates a high level signal at its output, it has a relatively low trip point. As shown in the drawing, the input of the control section 12 is connected to the capacitor 18, such that the level of charge developed on the capacitor 18 is sensed by the control section 12. When a low level signal is being generated at the output of the control section 12, the FET 22 is nonconductive and the capacitor 18 is being charged through the resistor 16. When the charge on the capacitor 18 attains a level which is equal to the trip point of the control section 12 when the section 12 is generating a low level signal at its output, the section 12 will toggle to supply a high level signal at its output to discharge the capacitor 18. However, when the control section 12 toggles from a low level output signal to a high level output signal, its trip point changes to a relatively low trip point. Accordingly, the capacitor 18 discharges to a relatively low level before the control section 12 toggles again.

The above described operating characteristics of the control section 12 will be better understood from the following description. The control section 12 includes a pair of enhancement FET's 26 and 28 connected in series with one another and having their gates connected through a resistor 30 to the capacitor 18. A depletion FET 32 is connected as a current source load for the inverter FET's 26 and 28. The drain of the FET 26 is connected to the gate of an enhancement FET 34 having its drain connected to the source of negative potential and its source connected to the source of the FET 26 and to the drain of the FET 28. The drain of the FET 26 is also connected to the gate of an enhancement FET 36. A depletion FET 38 is connected as a current source load for the FET 36, such that the output signal developed on the line 24 is the complement of the signal developed at the drain of the FET 26.

Initially, when the capacitor 18 is discharged, the FET's 26 and 28 will be nonconductive and the current source load FET 32 will supply a high level voltage to the gate of the FET 34 to cause it to be conductive. The conduction of the FET 34 will cause the source of the FET 26 to be at a high level. Since the drain of the FET 26 is at a high level, the output signal on the line 24 will be at a low level such that the capacitor 18 will charge.

The charge and discharge of the capacitor 18 versus time is represented by the waveform illustrated in FIG. 2, with the portion 40 of the waveform representing the charge of the capacitor 18 and the portion 42 of the waveform representing the discharge of the capacitor 18. When the capacitor 18 has charged to a level equal to one threshold voltage drop, the FET 28 will be rendered conductive. As the charge on the capacitor 18 increases beyond that voltage level, the drain of the FET 28 will move from a high level toward a low level.

The voltage developed at the drain of the FET 28 versus time is represented by the waveform illustrated in FIG. 3. As shown therein, as the charge on the capacitor 18 increases beyond the level equal to one threshold voltage drop, the voltage on the drain of the FET 28 will decrease. As the saturation point is achieved in the FET 28, the rate of change of the voltage at the drain of the FET 28 will decrease as represented in FIG. 3. Until the charge on the capacitor 18 attains a level which is one threshold voltage drop higher than the voltage level at the source of the FET 26, the FET 26 will remain nonconductive. However, when the charge on the capacitor 18 attains a level which is one threshold voltage drop more negative than the voltage at the source of the FET 26, the FET 26 will become conductive.

As soon as the FET 26 becomes conductive, the voltage at its drain and, therefore, the voltage at the gate of the FET 34 will move to a lower level. This change in the voltage at the gate of the FET 34 will reduce the current through the FET 34 and hence the FET 28 and cause the voltage at the drain of the FET 28 and the source of the FET 26 to move to a still lower level. This transition of the voltage at the drain of the FET 28 and the source of FET 26 caused by the initiation of conduction of the FET 26 is represented by the transition in the waveform illustrated in FIG. 3 and designated with reference numeral 44. As the voltage level at the drain of the FET 28 and the source of the FET 26 moves toward a lower level, the conduction of the transistor 26 increases rapidly, thereby further lowering the voltage level at its drain and, therefore, at the gate of the FET 34. It can be appreciated, therefore, that the initiation of conduction of the FET 26 produces a regenerative action such that its drain is quickly discharged. The voltage at the drain of the FET 26 versus time is represented by the waveform illustrated in FIG. 4.

When the voltage on the drain of the FET 26 moves from a high level to a low level as shown in FIG. 4, the trip point of the stage including the FET's 36 and 38 is attained, such that the control section 12 toggles. The voltage at the output of the control section 12 on the line 24 versus time is represented by the waveform illustrated in FIG. 5. Accordingly, immediately following the initiation of conduction of the FET 26, the output signal on the line 24 will change from a low level to high level to cause the FET 22 to become conductive. Accordingly, the capacitor 18 will discharge as represented by the portion 42 of the waveform illustrated in FIG. 2.

After the FET 26 has been rendered conductive, the trip point of the control section 12 will change to a relatively low level, such that the capacitor 18 must discharge to a relatively low level before the state of the control section 12 will again change.

More particularly, when the FET 26 is conductive, the drain of the FET 28 and the source of the FET 26 is relatively close to ground potential. Thereafter, as the capacitor 18 discharges to a level which is one threshold voltage drop more negative than the voltage at the drain of the FET 28 and the source of the FET 26, the FET 26 will begin to change from a conductive state to a nonconductive state. As the capacitor 18 discharges further from that level, the FET 28 will be rendered nonconductive. When the FET 26 is rendered nonconductive, the voltage on the gate of the FET 34 will increase to a high level, thereby rendering the FET 34 conductive. Such conduction of the FET 34 will immediately raise the voltage on the drain of the FET 28 to a high level, thereby returning the control section 12 to its initial state.

As previously mentioned, the integrated circuit oscillator of the present invention is substantially insensitive to variations in process parameters and variations in the voltage level of the power supply. Any variations in process parameters will influence the operating characteristics of all FET's in a like manner. Accordingly, any change in the operating characteristics of the FET 34 as a result of variations in process parameters will produce a like change in the operating characteristics of the FET 28. It can be appreciated, therefore, that the voltage at the drain of the FET 28 will be substantially unaffected by variations in process parameters. Since the voltage at the drain of the FET 28 which is employed for biasing the FET 26 remains constant due to the regenerative effect of the FET 26, and since the period of oscillation is determined by the level of charge on the capacitor 18 at which the FET 26 becomes conductive, which is one threshold voltage drop more negative than the voltage at its source, the period of oscillation will also be substantially unaffected by changes in process parameters.

Variations in the voltage level of the power supply will also cancel, thereby reducing the influence of such variations on the period of oscillation. Any change in the voltage level of the power supply will produce a change in the rate of charge of the capacitor 18. However, such a change in the voltage level of the power supply will also produce a change in the voltage level at the drain of the FET 28. If, for example, the voltage level of the power supply increases, the charge on the capacitor 18 will increase at a faster rate, thereby attaining a particular voltage level in a shorter time period. However, the voltage level at the drain of the FET 28 will also increase, such that the charge on the capacitor 18 must increase to a higher level before the FET 26 will be rendered conductive. Accordingly, it can be appreciated that the period of oscillation is substantially insensitive to variations in the voltage level of the power supply.

The output section 14, with the exception of the size of the FET's contained therein, is identical to the first stage of the control section 12. More particularly, the output section 14 includes a pair of FET's 46 and 48 connected in series with one another and having their gates connected through the resistor 30 to the capacitor 18. A depletion FET 50 is connected as a current source load for the FET's 46 and 48. The drain of the FET 46 is connected to the gate of the FET 52 which is connected between the source of negative potential and the drain of the FET 48. An output is provided at the drain of the FET 46 on a line 54. The FET's 48 and 52 are dimensioned such that the FET 46 will be rendered conductive prior to the initiation of conduction of the FET 26. The voltage at the drain of the FET 48 versus time is represented by the waveform illustrated in FIG. 6. Accordingly, it can be appreciated that the FET 46 is biased at a lower level at its source, such that it is rendered conductive at approximately the mid point of the charging time of the capacitor 18. Accordingly, an output is provided on the line 54 which is represented by the waveform illustrated in FIG. 7. It can be appreciated that the waveform illustrated in FIG. 7 is symmetrical. From the discussion concerning the effects of variations in process parameters and variations in the voltage level of the power supply on the control section 12, it can be appreciated that these variations have a similar effect on the output section 14. Accordingly, the output section 14 is also substantially insensitive to variations in process parameters and variations in the voltage level on the power supply.

Since variations in process parameters do not have a cancelling effect on one another during the discharge of the capacitor 18, the oscillator circuit is dimensioned to provide a relatively rapid discharge time. Because of this, the resulting output signal of the control section 12 is not suitable for use by other circuits, since it has a pulse width which is of relatively short time duration. In a constructed embodiment of the present invention, the width of the negative going pulse illustrated in FIG. 5 was approximately five percent of the duty cycle of the oscillator circuit. Accordingly, the output circuit 14 is employed to provide an output having a pulse width equal to one half the duty cycle. It can be readily appreciated that other types of output circuits can be employed for performing this function. However, the symmetrical characteristics of the output circuit 14 will not vary with variations in process parameters and variations in the voltage level of the power supply. Accordingly, the output circuit 14 is preferable to other types of output circuits.

The invention claimed is:
1. An oscillator comprising:
   a. a capacitor,
   b. a resistor connected in series with said capacitor and forming a conductive path for charging said capacitor,
   c. means for discharging said capacitor, and
   d. circuit means connected to said capacitor and having a relatively high trip point in a first state thereof wherein its output is at a relatively low level for disabling said discharging means while in said first state and a relatively low trip point in a second state thereof wherein its output is at a relatively high level for enabling said discharging means while in said second state, and further wherein said circuit means includes a first transistor having its input connected to said capacitor, and means re- sponsive to the level of charge on said capacitor for biasing said first transistor with a first voltage which changes with and in the same direction as the charge on said capacitor, such that the trip point of the stage containing said first transistor is relatively high, and is further responsive to the conduction of said first transistor for biasing said first transistor with a second voltage which is substantially lower than the maximum amplitude of said first voltage.

2. The oscillator of claim 1, wherein said biasing means includes a second transistor and a third transistor in series with one another, with said first and second voltages being developed at the juncture of said second and third transistors, such that variations in transistor parameters due to the manufacturing process which produced the transistors affecting said second and third transistors do not alter said first and second voltages and variations in the voltage level of a power supply connected thereto do not affect the bias on said first transistor.

3. The oscillator of claim 2, wherein said first, second and third transistors are integrated circuit field effect transistors.

4. The oscillator of claim 2, wherein said first transistor is connected in series with said second transistor, and further comprising a current source load connected in series with said first and second transistors and to the input of said third transistor, and wherein the input of said second transistor is connected to the input of said first transistor.

5. The oscillator of claim 4, wherein said discharging means includes a fourth transistor connected in parallel with said capacitor, and further comprising an inverter connected between the output of said circuit means and the input of said fourth transistor.

6. An oscillator comprising:
a. a capacitor,
b. a resistor connected in series with said capacitor and forming a conductive path for charging said capacitor,
c. means for discharging said capacitor,
d. circuit means connected to said capacitor and having a relatively high trip point in a first state thereof wherein its output is at a relatively low level for disabling said discharging means while in said first state and a relatively low trip point in a second state thereof wherein its output is at a relatively high level for enabling said discharging means while in said second state, and an output circuit connected to said capacitor and having a relatively high trip point in a first state thereof equal to approximately one half the amplitude of the maximum charge on said capacitor and a relatively low trip point in a second state thereof equal to approximately the lowest level of charge on said capacitor, wherein said output circuit includes a first transistor having its input connected to said capacitor, a second transistor connected in series with said first transistor and having its input connected to said capacitor, and a third transistor connected in series with said second transistor, such that variations in transistor parameters due to the manufacturing process which produced the transistors do not affect the voltage at the juncture of said first and second transistors and variations in the voltage level of a power supply connected thereto do not affect the bias on said first transistor.

* * * * *